United States Patent [19]

Uneno et al.

[11] Patent Number: 4,714,668
[45] Date of Patent: Dec. 22, 1987

[54] METHOD FOR PATTERNING LAYER HAVING HIGH REFLECTANCE USING PHOTOSENSITIVE MATERIAL

[75] Inventors: Tsunehisa Uneno, Tokyo; Yutaka Kamata; Sinji Miyazaki, both of Yokohama, all of Japan

[73] Assignee: Tokyo Shibaura Denki Kabushiki Kaisha, Japan

[21] Appl. No.: 878,004

[22] Filed: Jun. 24, 1986

Related U.S. Application Data

[62] Division of Ser. No. 510,224, Jul. 1, 1983.

[30] Foreign Application Priority Data

Jul. 5, 1982 [JP] Japan ................... 57-115449

[51] Int. Cl.⁴ .................... G00F 7/26; G03C 1/84
[52] U.S. Cl. .................... 430/316; 430/272; 430/275; 430/276; 430/278; 430/317; 430/318; 430/323; 156/652; 156/653; 156/659.1
[58] Field of Search ............ 430/272, 276, 316, 317, 430/318, 323, 275, 278; 156/659.1, 652, 653

[56] References Cited

U.S. PATENT DOCUMENTS

| | | | |
|---|---|---|---|
| 2,791,504 | 5/1957 | Plambeck | 430/276 |
| 4,152,159 | 5/1979 | Daly et al. | 430/318 |
| 4,261,792 | 4/1981 | Tsuji et al. | 430/314 |
| 4,311,773 | 1/1982 | Kaneko et al. | 430/289 |

FOREIGN PATENT DOCUMENTS

| | | |
|---|---|---|
| 1597597 | 9/1970 | Fed. Rep. of Germany . |
| 2924475 | 1/1981 | Fed. Rep. of Germany . |
| 3234066A1 | 9/1981 | Fed. Rep. of Germany . |
| 2197235 | 8/1972 | France . |
| 1439153 | 4/1973 | United Kingdom . |
| 2040498A | 10/1979 | United Kingdom . |
| 2108756 | 5/1983 | United Kingdom . |

OTHER PUBLICATIONS van den Berg and van Staden, "Antireflection Coatings on Metal Layers for Photolithographic Purposes", 3/1979, J. Appl. Phys. 50 (3).
Matsuyama, Igarashi, Majima and Orihara, "Fabrication of 3 um Bubble 80 kbit Chips", Fujitsu Laboratories Ltd., Kawasaki, Japan.
IBM Technical Disclosure Bulletin, vol. 14, No. 3, Aug. 1971, "Anti–interference and Antireflection Coatings for Chromium Masks".

Primary Examiner—Richard L. Schilling
Attorney, Agent, or Firm—Finnegan, Henderson, Farabow, Garrett & Dunner

[57] ABSTRACT

A method for patterning a layer having a high reflectance includes directly forming on a layer having a high reflectance a light-absorbing film having a ratio of transmitted light intensity to exposing incident light intensity of not more than 30% and forming a photosensitive material film on the light-absorbing film. A selected region of the photosensitive material film is irradiated with the exposing incident light, and the photosensitive material film is developed to form a first pattern. The light-absorbing film is selectively etched using the first pattern as a mask so as to form a second pattern. Finally, the layer having the high reflectance is selectively etched using the second pattern as a mask.

5 Claims, 8 Drawing Figures

F I G. 6
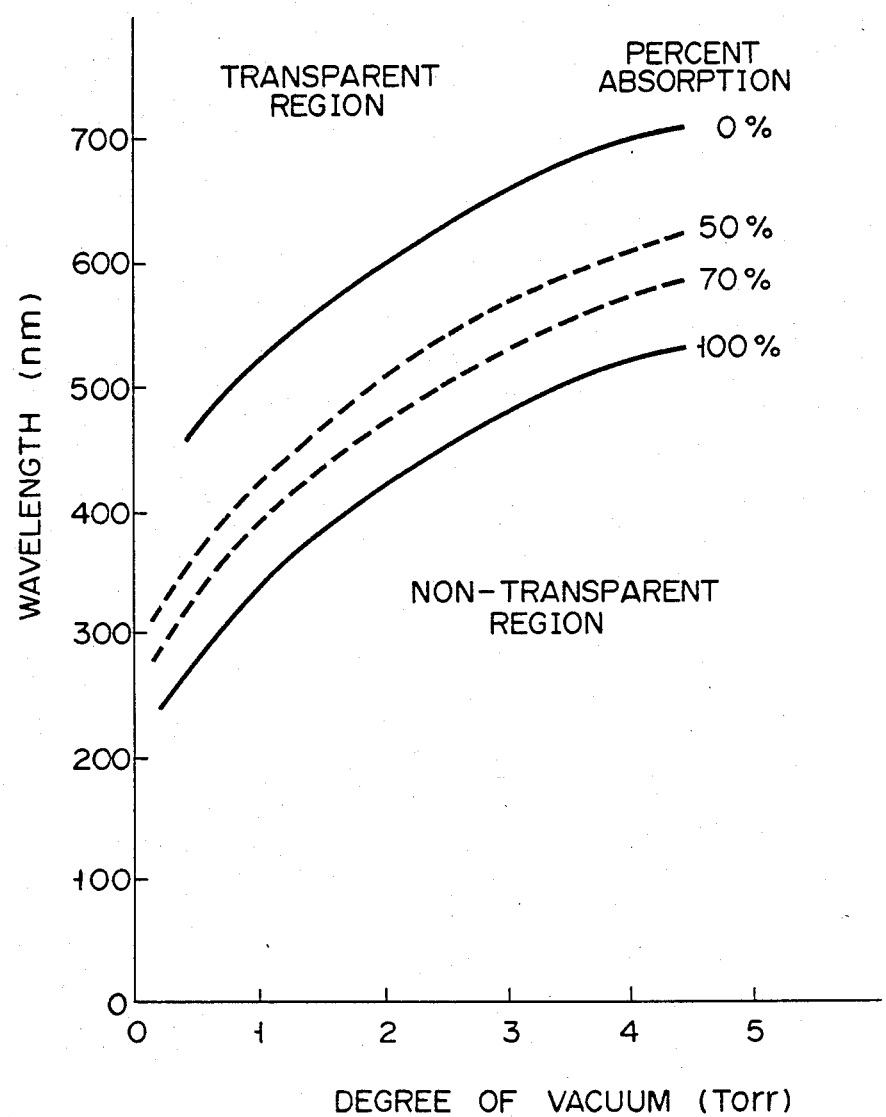

F I G. 7
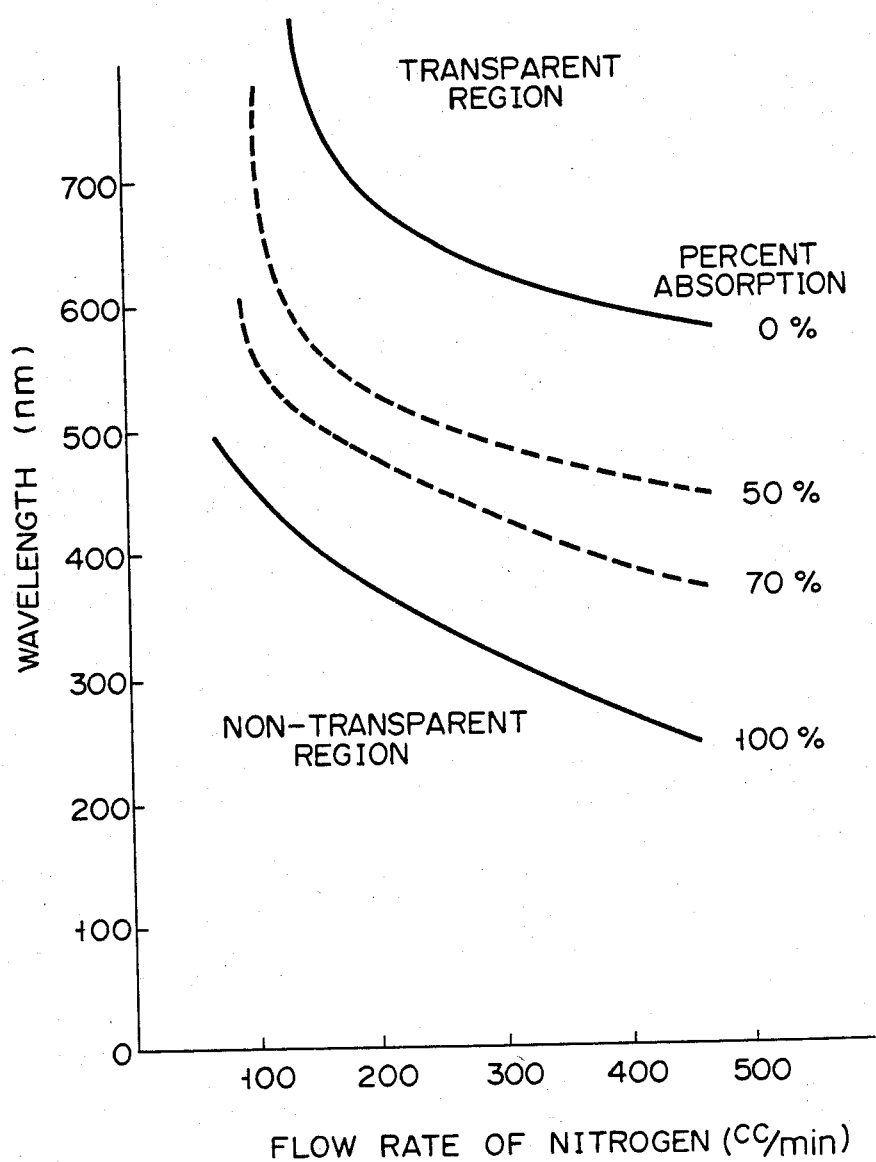

METHOD FOR PATTERNING LAYER HAVING HIGH REFLECTANCE USING PHOTOSENSITIVE MATERIAL

This is a division of application Ser. No. 510,224, filed July 1, 1983.

BACKGROUND OF THE INVENTION

1. Field of the Invention

The present invention relates to a method for manufacturing a semiconductor device and, more particularly, to a method for patterning a layer having a high reflectance using a photosensitive material film.

2. Description of the Prior Art

In the manufacture of semiconductor devices, a conductive layer such as an aluminum layer is patterned using a photosensitive material film in order to obtain a wiring layer. A positive- or negative-working photoresist is used as a photosensitive material film. As is well known, the portion of a positive-working photoresist which is exposed decomposes and can be removed by developing, thereby providing an etching mask used in etching a conductive layer. Conversely, the portion of a negative-working photoresist which is exposed is hardened and the portion which is not exposed can be removed by developing, thereby providing an etching mask.

A conventional method for etching an aluminum layer using a positive-working photoresist will be described with reference to FIG. 1. An aluminum layer 3 is formed by, for example, vapor deposition on a semiconductor wafer 1 through an oxide film 2. A positive-working photoresist film 4 is formed on the aluminum layer 3. A photomask 5 having a nontransparent region 5a and a transparent region 5b is arranged above this structure.

Collimated light 6 from a light source (not shown) is transmitted only through the transparent region 5b of the photomask 5 and exposes the photoresist film 4 in a predetermined pattern. If the oxide film 2 has an inclined surface 2a and the aluminum layer 3 correspondingly has an inclined surface 3a, light is reflected due to the high reflectance of aluminum. The transverse reflected light 6a exposes the portion of the photoresist film 4 which should not be exposed. When this happens, a desired etching mask pattern cannot be obtained after developing. When the aluminum layer 3 is etched using the photoresist film having such a mask pattern, an aluminum wiring layer 3' as shown in FIG. 2 is obtained. Referring to FIG. 2, an edge line 3'b of the aluminum wiring layer 3' close to the inclined surface 2a does not extend to a correct pattern edge line indicated by an alternating long-and-short dashed line 3'a. In the worst case, a disconnection 3'c may be formed. Needless to say, a semiconductor device having such an aluminum wiring layer 3' cannot perform its intended function.

On the other hand, when an aluminum wiring layer as described above is obtained using a negative-working photoresist, the above-mentioned problem is not encountered since the positional relationship between the transparent and nontransparent regions of the photomask used is the opposite of that described above. However, incident light for hardening a predetermined part of a negative-working photoresist film is reflected by the aluminum layer underlying the negative-working photoresist film. Then, the reflected light and the incident light cause interference in the negative-working photoresist film to generate intense standing waves, which leads to nonuniform exposure of the photoresist film in the direction of its thickness. The photoresist film is exposed only to weak light, especially in the vicinity of the surface of the aluminum layer. When such a photoresist film is developed, the portion thereof which ought to remain instead separates away.

This phenomenon associated with a negative-working photoresist is also experienced with a positive-working photoresist. In the latter case, the portion of the positive-working photoresist film which is to be removed remains unremoved, and the aluminum wiring layer may be short-circuited by any adjacent aluminum wiring layer. This short-circuiting will also occur when the positive-working photoresist 4 is replaced by a negative-working photoresist and the same photomask 5 is used as shown in FIG. 1.

The phenomena as described above are encountered not only in the patterning of aluminum layers but also in the patterning of other inorganic conductive material layers having a high reflectance.

SUMMARY OF THE INVENTION

It is, therefore, an object of the present invention to provide a method which allows high-precision patterning of a layer having a high reflectance.

It is another object of the present invention to provide a method for patterning a high reflectance layer which will not cause separation of a photosensitive material film and disconnection or short-circuiting of a patterned layer when such a layer, having a high reflectance with respect to incident light, is patterned using a photosensitive material film.

Broadly speaking, according to the present invention, a light-absorbing film having a ratio of transmitted light intensity to incident light intensity of 30% or less is formed directly on a layer to be patterned, and a photosensitive material film is formed directly on the light-absorbing film. A selected region of the photosensitive material film is irradiated with collimated light and is developed to form a first pattern. Using this first pattern as a mask, the light-absorbing film is etched to form a second pattern. Finally, using the second pattern as a mask, the layer to be patterned is formed into a desired pattern.

In the specification and claims, "the ratio of transmitted light intensity to incident light intensity" means the percentage of the intensity of reflected light with respect to the intensity of the incident light.

BRIEF DESCRIPTION OF THE DRAWINGS

FIGS. 6 to 8 are graphs showing the light-absorption characteristics of respective light-absorbing films used in the present invention.

DETAILED DESCRIPTION OF THE PREFERRED EMBODIMENTS

The present invention will now be described with reference to the accompanying drawings.

Figure 4:
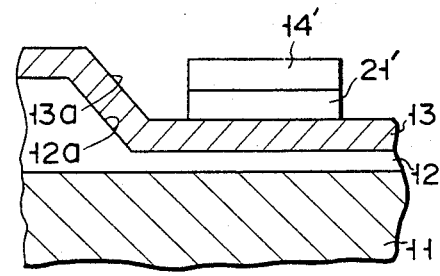
Figure 5:
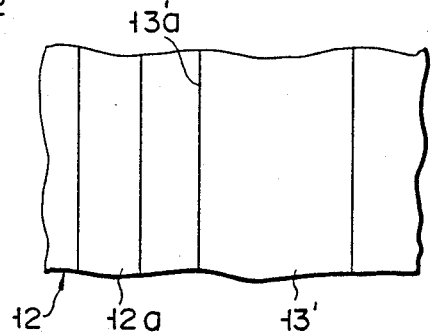
FIG. 5 is a plan view showing a patterned layer formed by the patterning method of the present invention.

The basic steps of the method of the present invention will now be described with reference to FIGS. 3 to 5. In the embodiment shown in these figures, the present invention is applied to patterning of a conductive layer having a high reflectance using a positive-working photoresist.

Figure 1:
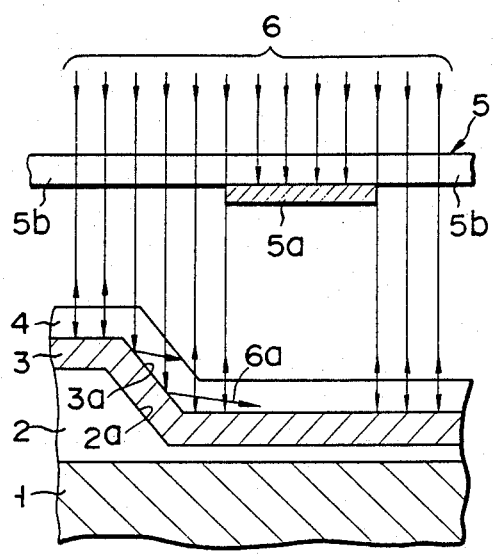
FIG. 1 is a schematic view showing a conventional patterning method.
Figure 2:
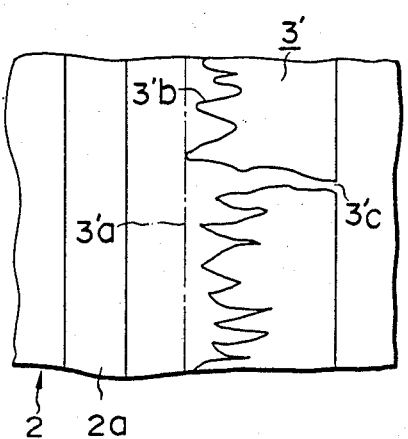
FIG. 2 is a plan view showing a patterned layer formed by the conventional patterning method.
Figure 3:
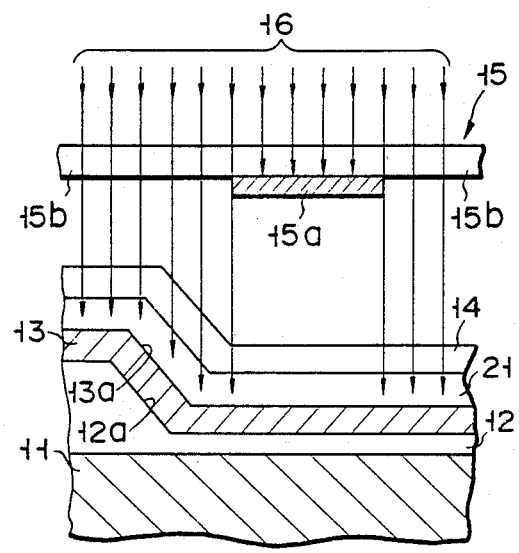
FIGS. 3 and 4 are schematic views for explaining a patterning method according to the present invention.

Referring to FIG. 3, a conductive layer 13 having a high reflectance is formed through an insulating film 12 on a semiconductor substrate 11 which has predetermined semiconductor regions (not shown) formed by doping an impurity. Subsequently, a light-absorbing film 21 is formed on the conductive layer 13. The light-absorbing film 21 has a ratio of transmitted light intensity to incident light intensity of 30% or less.

After forming a positive-working photoresist film 14 on the light-absorbing film 21, the positive-working photoresist film 14 is irradiated with collimated light 16 through a photomask 15 having a nontransparent region 15a and a transparent region 15b. Light transmitted through the transparent region 15b exposes the positive-working photoresist film 14 in a predetermined pattern, and the irradiated portion of the film 14 decomposes. Even if the insulating film 12 has an inclined surface 12a and the conductive layer 13 has a corresponding inclined surface 13a, the incident light is absorbed during transmission within the light-absorbing film 21 and may not reach the surface of the conductive layer 13. Even if the light reaches and is reflected by the inclined surface 13a, the intensity of such reflected light is 30% or less of that of the incident light so that it is incapable of exposing the photoresist film 14.

The incident light on the flat portion of the conductive layer 13 is absorbed while it is being transmitted through the light-absorbing film 21. Accordingly, even if the light reaches and is reflected by the surface of the conductive layer 13, the reflected light which is weaker than the incident light, does not cause interference with the incident light, and so does not cause standing waves.

After the photoresist film 14 is exposed in a predetermined pattern according to the pattern of the photomask 15, it is developed and is post-baked to form a photoresist pattern 14'. Using the photoresist pattern 14' as a mask, the light-absorbing film 21 is selectively etched to form a light-absorbing pattern 21' (FIG. 4).

Finally, after the conductive layer 13 is selectively etched using the light-absorbing pattern 21' as an etching mask, the photoresist pattern 14' and the light-absorbing pattern 21' are sequentially removed, thereby forming a conductive pattern 13' (FIG. 5) with a high precision. As shown in FIG. 5, an edge line 13'a of the conductive pattern 13' which is at the side of the inclined surface 12'a of the insulating film 12 is sharp, as intended.

As has been described earlier, the light-absorbing film used in the method of the present invention has a ratio of transmitted light intensity to incident light intensity of 30% or less. In other words, when the incident light intensity is given as Io and the transmitted light intensity is given as I, the following relation is satisfied:

$$(I/Io) \times 100 \leq 30 \quad \text{(A)}$$

As is well known, the transmitted light intensity I is given by:

$$I = Io \times e^{-at} \quad \text{(B)}$$

where $a$ is the absorption coefficient and $t$ is the film thickness. It can be seen that the transmitted light intensity I is dependent on both the thickness and the absorption coefficient of the film through which the light is transmitted. Therefore, in order to obtain a light-absorbing film which will satisfy relation (A) above, the material (which is a factor determining the absorption coefficient) and the thickness of the film must be properly controlled. According to the present invention, the layer to be patterned has a thickness of 0.2 to 1 $\mu$m, and the light-absorbing film generally has a thickness of 1,000 to 5,000 Å. Accordingly, the material of the light-absorbing film is determined so as to satisfy relation (A) above with a film thickness which is within this range.

The material of the light-absorbing film may be selected from those which are frequently used in the manufacture of semiconductor devices. Examples of such materials include silicon nitride or oxide, aluminum oxide, and amorphous silicon. However, it should be noted that, except for amorphous silicon, the chemical compositions of these light-absorbing materials do not correspond to their stoichiometries. More specifically, the silicon nitride has an intermediate composition between that of amorphous silicon and that of trisilicon tetranitride ($Si_3N_4$). The silicon oxide has a composition intermediate between amorphous silicon and silicon dioxide ($SiO_2$). The aluminum oxide has a composition intermediate between aluminum and alumina ($Al_2O_3$).

A light-absorbing material having such a nonstoichiometrical composition may be prepared by various techniques well known per se in the art such as plasma chemical vapor deposition (plasma CVD), photochemical vapor deposition (photo-CVD), or ion plating. For example, the silicon nitride is prepared from a mixture of silane and ammonium by plasma CVD or photo-CVD. The silicon nitride may also be prepared by ion plating in a nitrogen-containing atmosphere using silicon as a plating source. The silicon oxide may be prepared by any of the above-mentioned techniques. The aluminum oxide may be conveniently prepared by ion plating in an oxygen-containing atmosphere using aluminum as a plating source. Amorphous silicon is prepared from silane by plasma CVD or photo-CVD.

The light-absorbing characteristics of the light-absorbing film material thus prepared change in accordance with the deposition conditions. An example involving the silicon nitride prepared from a mixture of silane and ammonium by plasma CVD will now be considered. The factor which most influences the light-absorbing characteristics of the silicon nitride is the degree of vacuum in the reaction chamber. The mixing ratio of silane and ammonium, the flow rate of a carrier gas (e.g., nitrogen) and high-frequency power are also important factors, but to a lesser extent. Accordingly, the silicon nitride film to satisfy relation (A) may be formed by a suitable selection of these factors.

FIG. 6 shows the percent absorption $\{(Io-I)/Io \times 100\}$ of the silicon nitride films (1500 Å thickness) for light having a given wavelength. A diffusion furnace-type or tube-type plasma reaction apparatus (available from PMS, Inc. or ASM, Inc.) was used which is capable of varying the degree of vacuum in the reaction chamber to some extent. The degree of vacuum was varied under the conditions of a molar ratio of ammonium to silane (NH$_3$/SiH$_4$) of 8, a temperature of 300° to 350° C., a flow rate of nitrogen gas (carrier gas) of 100 cc/min, and a high-frequency power of 300 W. As may be seen from the graph shown in FIG. 6, in order to prepare a silicon nitrogen film which satisfies relation (A) (70% or more percent absorption) for light having a wavelength of 450 nm or less (to which conventional positive- or negative-working photoresists are sensitive), the degree of vacuum in the reaction chamber needs to be about 1.8 Torr or higher.

FIG. 7 shows the percent absorption of the silicon nitride films (1500 Å thickness) formed by using a bell jar-type plasma reaction apparatus available from AMT, Inc. The flow rate of nitrogen gas as a carrier gas was varied using a reaction chamber at a vacuum pressure of 0.2 to 0.3 Torr, a temperature of 300° to 350° C., a molar ratio of NH$_3$/SiH$_4$ from 0.5 to 0.8, and a high-frequency power of 500 W. As may be seen from this graph, in order to prepare a silicon nitride film which satisfies relation (A) for light having a wavelength of 450 nm or less, the flow rate of nitrogen gas should be about 250 cc/min or less.

Figure 8:
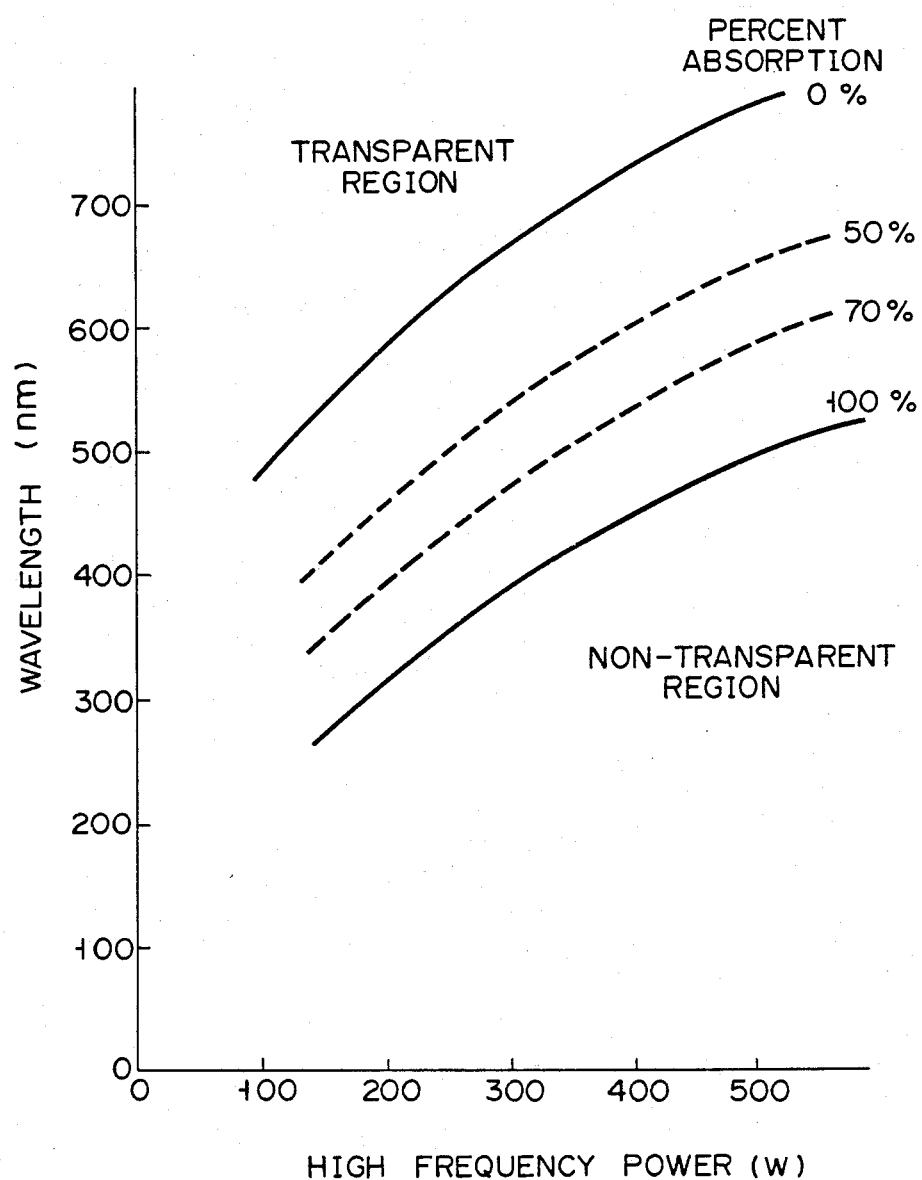

When silicon nitride films were prepared under the same conditions as those of the films of FIG. 7, except that the high-frequency power was varied and the flow rate of nitrogen gas was kept at 100 cc/min, the absorption characteristics shown in FIG. 8 were obtained. As may be seen from this graph, in order to prepare a silicon nitride film which satisfies relation (A) for light having a wavelength of 450 nm or less, the high-frequency power should be about 270 W or lower.

In this manner, when a silicon nitride film is prepared by plasma CVD, a light-absorbing film having desired light-absorbing characteristics may be formed by suitably selecting the conditions such as the degree of vacuum in the reaction chamber, the flow rate of the carrier gas, or the high-frequency output.

When a light-absorbing film is prepared by photo-CVD, its composition may be controlled according to the compositions of the starting materials. When a light-absorbing film is prepared by ion plating, its composition may be controlled by the atmospheric composition.

In any case, the conditions for preparing a light-absorbing film may be easily determined by simple preliminary experiments.

The present invention can be suitably adapted for patterning a film which has a high reflectance which is defined as 90% or higher and which has a metallic gloss, such as a vapor-deposited aluminum film, a polycrystalline silicon film, a tungsten film, a molybdenum film or a molybdenum silicide film. The light-absorbing film has a better adhesion strength with such a conductive film than does a photoresist film. Therefore, when a conductive layer is etched (by e.g., chemical dry etching, wet etching, electrolytic etching or the like) using the light-absorbing film as an etching mask, the conductive layer is not etched at its portion underlying the light-absorbing film.

Since the etching ratio of the light-absorbing film and a conductive layer is large (especially in dry etching) except for a combination of amorphous silicon and polycrystalline silicon, the conductive layer may be patterned with higher precision.

Since a thin light-absorbing film (5,000 Å or less) may be used, micropatterning may be performed.

EXAMPLE 1

After a silicon substrate was doped with an impurity to form semiconductor regions by the conventional method, an oxide layer was formed thereover. A contact hole partially exposing the semiconductor region was formed in the oxide layer. The resultant structure resembles that shown in FIG. 3. Aluminum was vapor-deposited on the structure to a thickness of 1 μm. A silicon nitride film of 3,000 Å thickness was formed on the aluminum layer under the following conditions:

| | |
|---|---|
| Plasma reaction apparatus used: | AMP-3300 available from AMT, Inc. |
| NH$_3$/SiH$_4$ molar ratio: | 0.5 |
| Degree of vacuum in reaction chamber: | 0.2 Torr |
| Flow rate of nitrogen gas: | 200 cc/min |
| High-frequency output: | 500 W |

A commercially available positive-working photoresist (photosensitive wavelength of 436 nm) was deposited to a thickness of 12,000 Å on the obtained silicon nitride film, and pre-baked. After placing a photomask having a predetermined pattern at a predetermined position, the photoresist was exposed to the predetermined pattern using an ultra high-voltage mercury lamp, and was then developed. The remaining photoresist film had a desired pattern and was post-baked. Using the post-baked photoresist film as a mask, the silicon nitride film was selectively removed by chemical dry etching. Using the remaining silicon nitride film as a mask and without removing the photoresist film, the aluminum layer was selectively removed by reactive ion etching. Thereafter, the remaining photoresist film was removed by oxygen plasma etching. Subsequently, the remaining silicon nitride film was removed by chemical dry etching.

The patterned aluminum layer had a desired pattern (which resembled the pattern 13' shown in FIG. 5) and had a sharp edge.

Etching of the aluminum layer may be performed instead after removal of the photoresist film.

COMPARATIVE EXAMPLE

Procedures similar to those in Example 1 were followed except that a silicon nitride film was not used. The aluminum layer obtained had an edge which did not extend to the desired edge.

As has been described above, the principle of the present invention utilizes the fact that a plasma CVD silicon nitride film, a photo-CVD silicon nitride film, an amorphous silicon film, a silicon oxide film or silicon nitride film formed by ion plating, or an aluminum oxide film each has different spectral characteristics and different nontransparent wavelengths for ultraviolet or for ultraviolet radiation depending upon their deposition conditions. Utilizing this, a light absorbing film which has a sufficiently low ratio of transmitted light intensity to incident light intensity which is negligible with respect to the exposure sensitivity of the photoresist film is formed between a layer to be patterned and a photoresist film. Accordingly, light transmitted through the photoresist film is decreased in intensity while passing through the light absorbing film. Even if the light is reflected by the layer to be patterned the reflected light is decreased in intensity in the light absorbing film again. Even if exposure light becomes incident on the photoresist film again, the reflected light can only provide negligible effects on the spectral characteristics of the photoresist. Thus, reflected light from the layer to be patterned may not be substantially present and standing waves may not be produced.

According to the present invention, short-circuiting or disconnection, which is usually caused by reflected light from a conductive layer having a high reflectance or by standing waves, will not be caused. The photoresist film will also not be easily separated, resulting in a higher yield and better reliability of semiconductor devices.

In the embodiment described above, light is used as the incident radiation. However, the present invention is not limited in this respect. For example, the present invention may be similarly applied to the direct exposure method using an electron beam or to a method utilizing X-rays.

What we claim is:

1. A method for patterning a layer having high reflectance, which is defined as 90% or greater, comprising the steps of:

providing a semi-conductor substrate for support of said layer, wherein said layer is conductive and includes an inclined surface portion;

directly forming on said layer a light-absorbing film having a ratio of transmitted light intensity to exposing incident light intensity of not more than 30%; said film covering the inclined surface portion of said layer, said film comprising at least one light absorbing material selected from a group consisting of silicon oxide and aluminum oxide, said silicon oxide and aluminum oxide having non-stoichiometric compositions, said light absorbing material being formed by plasma CVD, photo-CVD or ion plating;

forming a photosensitive material film on said light-absorbing film;

irradiating a selected region of said photosensitive material film with the exposing incident light;

developing said photosensitive material film to form a first pattern;

selectively etching said light-absorbing film using said first pattern as a mask so as to form a second pattern; and selectively etching said layer having the high reflectance using said second pattern as a mask.

2. A method according to claim 1, wherein said light-absorbing material is formed by plasma CVD in which a degree of vacuum of an atmosphere including raw materials is controlled so as to establish said ratio of the transmitted light intensity to the incident light intensity.

3. A method according to claim 1, wherein said light-absorbing material is formed by plasma CVD in which a flow rate of nitrogen gas as a carrier gas is controlled so as to establish said ratio of the transmitted light intensity to the incident light intensity.

4. A method according to claim 1, wherein said light-absorbing material is formed by plasma CVD in which a high-frequency power is controlled so as to establish said ratio of the transmitted light intensity to the incident light intensity.

5. A method according to claim 1, wherein said photosensitive material is a negative-working photoresist.

* * * * *